(12) United States Patent
Chen

(10) Patent No.: US 8,980,729 B2
(45) Date of Patent: Mar. 17, 2015

(54) SILICON-ON-INSULATOR SUBSTRATE AND FABRICATION METHOD

(71) Applicant: Semiconductor Manufacturing International Corp., Shanghai (CN)

(72) Inventor: Aries Chen, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 21 days.

(21) Appl. No.: 13/795,086

(22) Filed: Mar. 12, 2013

(65) Prior Publication Data

US 2013/0241028 A1 Sep. 19, 2013

(30) Foreign Application Priority Data

Mar. 16, 2012 (CN) .......................... 2012 1 0071755

(51) Int. Cl.
| | |
|---|---|
| *H01L 21/00* | (2006.01) |
| *H01L 21/762* | (2006.01) |
| *H01L 29/06* | (2006.01) |
| *H01L 21/02* | (2006.01) |

(52) U.S. Cl.
CPC ...... *H01L 21/76254* (2013.01); *H01L 29/0649* (2013.01); *H01L 21/02002* (2013.01)
USPC ............................ 438/481; 438/478; 438/479

(58) Field of Classification Search
None
See application file for complete search history.

(56) References Cited

U.S. PATENT DOCUMENTS

| | | | |
|---|---|---|---|
| 7,341,927 B2 * | 3/2008 | Atwater et al. ............... | 438/473 |
| 7,348,260 B2 * | 3/2008 | Ghyselen ..................... | 438/458 |
| 2003/0003679 A1 * | 1/2003 | Doyle et al. .................. | 438/406 |
| 2003/0087503 A1 * | 5/2003 | Sakaguchi et al. ............ | 438/406 |
| 2005/0153524 A1 * | 7/2005 | Maa et al. ..................... | 438/458 |
| 2005/0250294 A1 * | 11/2005 | Ghyselen ...................... | 438/458 |
| 2006/0154445 A1 | 7/2006 | Iwabuchi | |
| 2006/0264008 A1 * | 11/2006 | Delattre ........................ | 438/479 |
| 2007/0026650 A1 * | 2/2007 | Hebras .......................... | 438/514 |
| 2007/0111474 A1 * | 5/2007 | Delattre et al. ................ | 438/459 |
| 2012/0126362 A1 * | 5/2012 | Akiyama et al. .............. | 257/507 |
| 2013/0099318 A1 * | 4/2013 | Adam et al. ................... | 257/351 |

FOREIGN PATENT DOCUMENTS

| | | |
|---|---|---|
| CN | 101197260 A | 6/2008 |
| CN | 101373710 A | 2/2009 |
| CN | 101901754 A | 12/2010 |
| JP | 2008153411 A | 7/2008 |
| TW | 201041015 A1 | 11/2010 |

OTHER PUBLICATIONS

"Chapter 8 Ion implantation" by Bo Cui.*

* cited by examiner

*Primary Examiner* — Charles Garber
*Assistant Examiner* — Evren Seven
(74) *Attorney, Agent, or Firm* — Anova Law Group, PLLC

(57) ABSTRACT

An SOI substrate and a method for forming the SOI substrate are provided. An SOI substrate can be formed by forming a silicon-germanium layer on a first baseplate. A top silicon layer can be formed on the silicon-germanium layer. A first insulating layer can be formed on the top silicon layer. An ion implanted layer can be formed in one of the silicon-germanium layer and the first baseplate. A second baseplate can be bonded to the first insulating layer. A first annealing process can be performed to anneal and split the one of the silicon-germanium layer and the first baseplate at the ion implanted layer. The silicon-germanium layer can be removed from the top silicon layer to expose the top silicon layer and to form the SOI substrate comprising the first insulating layer formed between the top silicon layer and the second baseplate.

20 Claims, 8 Drawing Sheets

SILICON-ON-INSULATOR SUBSTRATE AND FABRICATION METHOD

CROSS REFERENCE TO RELATED APPLICATIONS

This application claims priority to Chinese patent application No. 201210071755.1, filed on Mar. 16, 2012, and entitled "METHOD FOR FORMING SILICON ON INSULATOR SUBSTRATE", the entire disclosure of which is incorporated herein by reference.

FIELD OF THE DISCLOSURE

The disclosure relates to semiconductor manufacturing technology and, more particularly, to a silicon-on-insulator (SOI) substrate and a method for forming the SOI substrate.

BACKGROUND OF THE DISCLOSURE

A Silicon on Insulator (SOI) substrate is used as a substrate for integrated circuit (IC) manufacturing. Compared with a bulk silicon substrate, the SOI substrate may provide the ICs with low parasitic capacitance, high integration density, low short channel effect and fast speed, and dielectric isolation between components in the ICs. Use of SOI substrates may eliminate the parasitic latch-up effect, which often occurs when a bulk silicon substrate is used.

Currently, SOI substrates may be formed by a SIMOX (i.e., Separation by Implanted Oxygen) process, a silicon wafer bonding process, and a smart cut process. FIGS. 1-4 are cross-sectional structure diagrams illustrating a conventional process for forming an SOI substrate using a smart cut process.

Referring to FIG. 1, a first monocrystalline silicon sheet 10 and a second monocrystalline silicon sheet 20 are provided. A silicon oxide layer 30 is formed on the first monocrystalline silicon sheet 10. Referring to FIG. 2, hydrogen ions 40 are implanted into the first monocrystalline silicon sheet 10 via a silicon oxide layer 30. Referring to FIG. 3, the silicon oxide layer 30 and the second monocrystalline silicon sheet 20 are cleaned and bonded together. Referring to FIG. 4, the bonded structure including the first monocrystalline silicon sheet 10 and the second monocrystalline silicon sheet 20 is then annealed by a high-temperature annealing process. Due to existence of the implanted hydrogen ions, the first monocrystalline silicon sheet 10 is split into a third monocrystalline silicon sheet 11 and a fourth monocrystalline silicon sheet 12. As shown in FIG. 4, the third monocrystalline silicon sheet 11, the silicon oxide layer 30, and the second monocrystalline silicon sheet 20 form the SOI substrate. The third monocrystalline silicon sheet 11 serves as a top silicon layer of the SOI substrate, while the second monocrystalline silicon sheet 20 serves as a substrate silicon layer of the SOI substrate.

Micro-bubbles are often used to split the first monocrystalline silicon sheet 10 into the third monocrystalline silicon sheet 11 and the fourth monocrystalline silicon sheet 12. Large surface roughness may then be obtained for the split surface of the third monocrystalline silicon sheet 11 and the surface of the fourth monocrystalline silicon sheet 12. When a semiconductor device is formed directly on the split surface of the third monocrystalline silicon sheet 11 (which serves as the top silicon layer of the SOI substrate), defects are easy to occur due to the high surface roughness of the third monocrystalline silicon sheet 11. This may cause the semiconductor device to be scrapped. Therefore, after the formation of the SOI wafer, it needs to perform chemical mechanical polishing on the surface of the monocrystalline silicon sheet 11 to obtain small roughness of the surface of the monocrystalline silicon sheet 11.

However, to improve electrical properties of the SOI substrate, an Extremely Thin SOI (ETSOI) substrate has become used in IC manufacturing. The top silicon layer on the insulating layer of the ETSOI substrate is thin. MOS transistors formed on this ETSOI substrate may have low short-channel effect. Device isolation is achieved by LOCOS (i.e., local oxidation of silicon) or shallow STI (i.e., shallow trench isolation). However, it is difficult to control the thin thickness of the top silicon layer by conventional methods such as the smart cut process. In addition, when grinding or polishing the surface of the top silicon layer using the chemical mechanical polishing process to reduce the surface roughness of the top silicon layer, the thin top silicon layer may be overly ground or polished and defects may occur when subsequently forming semiconductor devices on the ETSOI substrate. The resulting semiconductor devices may thus be scrapped.

SUMMARY OF THE DISCLOSURE

The present disclosure provides an SOI substrate and a method for forming the SOI substrate to effectively control thickness and surface roughness of a top silicon layer of the SOI substrate.

According to various embodiments, there is provided a method for forming an SOI substrate. The SOI substrate can be formed by providing a first baseplate and a second baseplate and forming a silicon-germanium layer on the first baseplate. A top silicon layer can be formed on the silicon-germanium layer, the top silicon layer having a first surface and a second surface opposite to the first surface, and the first surface of the top silicon layer joining the silicon-germanium layer. A first insulating layer can be formed on the second surface of the top silicon layer. An ion implanted layer can be formed in one of the silicon-germanium layer and the first baseplate using an ion implantation process. The second baseplate can be bonded to the first insulating layer. A first annealing process can be performed to anneal the one of the silicon-germanium layer and the first baseplate to split at the ion implanted layer. The silicon-germanium layer can be removed from the first surface of the top silicon layer to expose the top silicon layer and to form the SOI substrate comprising the first insulating layer formed between the top silicon layer and the second baseplate.

According to various embodiments, there is also provided an SOI substrate. The SOI substrate can include a top silicon layer, a first insulating layer, and a second baseplate. The SOI substrate can be formed by providing a first baseplate and a second baseplate and forming a silicon-germanium layer on the first baseplate. A top silicon layer can be formed on the silicon-germanium layer, the top silicon layer having a first surface and a second surface opposite to the first surface, and the first surface of the top silicon layer joining the silicon-germanium layer. A first insulating layer can be formed on the second surface of the top silicon layer. An ion implanted layer can be formed in one of the silicon-germanium layer and the first baseplate using an ion implantation process. The second baseplate can be bonded to the first insulating layer. A first annealing process can be performed to anneal the one of the silicon-germanium layer and the first baseplate to split at the ion implanted layer. The silicon-germanium layer can be removed from the first surface of the top silicon layer to expose the top silicon layer and to form the SOI substrate comprising the first insulating layer formed between the top silicon layer and the second baseplate.

Because the ion implanted layer is located in the first baseplate or the germanium-silicon layer, rather than located in the top silicon layer, the split of the first baseplate or the germanium-silicon layer do not affect the thickness of the top silicon layer, thus the thickness of the top silicon layer is easily to be controlled.

Further, the silicon-germanium layer joining the top silicon layer is removed in a wet etching process or a dry etching process with desired etch selectivity over the top silicon layer. The thickness of the top silicon layer and surface roughness of the first surface of the top silicon layer are easily to be controlled. This facilitates formation of semiconductor device(s) on the first surface of the top silicon layer.

Other aspects or embodiments of the present disclosure can be understood by those skilled in the art in light of the description, the claims, and the drawings of the present disclosure.

DETAILED DESCRIPTION OF THE DISCLOSURE

Figure 1:
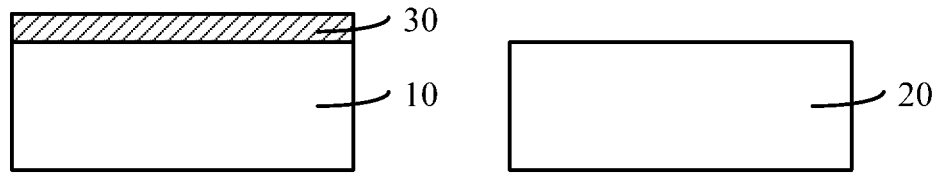
FIGS. 1-4 are cross-sectional structure diagrams illustrating a process for forming an SOI substrate using a smart cut process.
Figure 2:
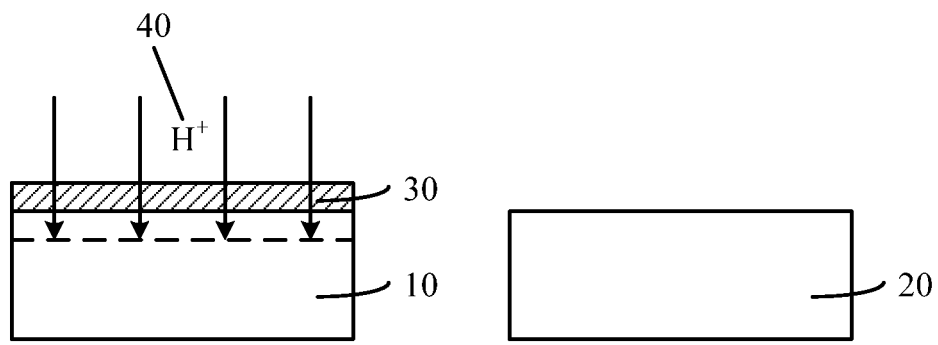
Figure 3:
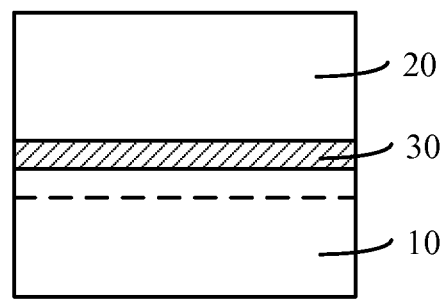
Figure 4:
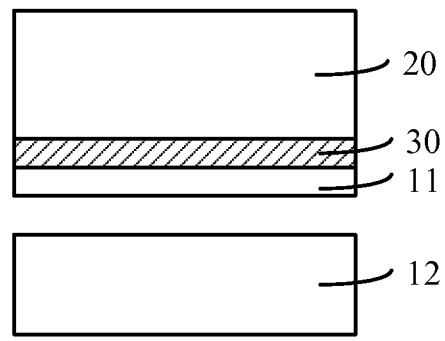

Reference will now be made in detail to exemplary embodiments of the disclosure, which are illustrated in the accompanying drawings. Wherever possible, the same reference numbers will be used throughout the drawings to refer to the same or like parts. For illustration purposes, elements illustrated in the accompanying drawings are not drawn to scale, which are not intended to limit the scope of the present disclosure. In practical operations, each element in the drawings has specific dimensions such as a length, a width, and a depth.

An SOI substrate and a method for forming the SOI substrate are provided to effectively control thickness and surface roughness of a top silicon layer of the SOI substrate.

For example, an SOI substrate can be formed by providing a first baseplate and a second baseplate and forming a silicon-germanium layer on the first baseplate. A top silicon layer can be formed on the silicon-germanium layer, the top silicon layer having a first surface and a second surface opposite to the first surface, and the first surface of the top silicon layer joining the silicon-germanium layer. A first insulating layer can be formed on the second surface of the top silicon layer. An ion implanted layer can be formed in one of the silicon-germanium layer and the first baseplate using an ion implantation process. The second baseplate can be bonded to the first insulating layer. A first annealing process can be performed to anneal the one of the silicon-germanium layer and the first baseplate to be split at the ion implanted layer. The silicon-germanium layer can be removed from the first surface of the top silicon layer to expose the top silicon layer and to form the SOI substrate comprising the first insulating layer formed between the top silicon layer and the second baseplate.

Figure 5:
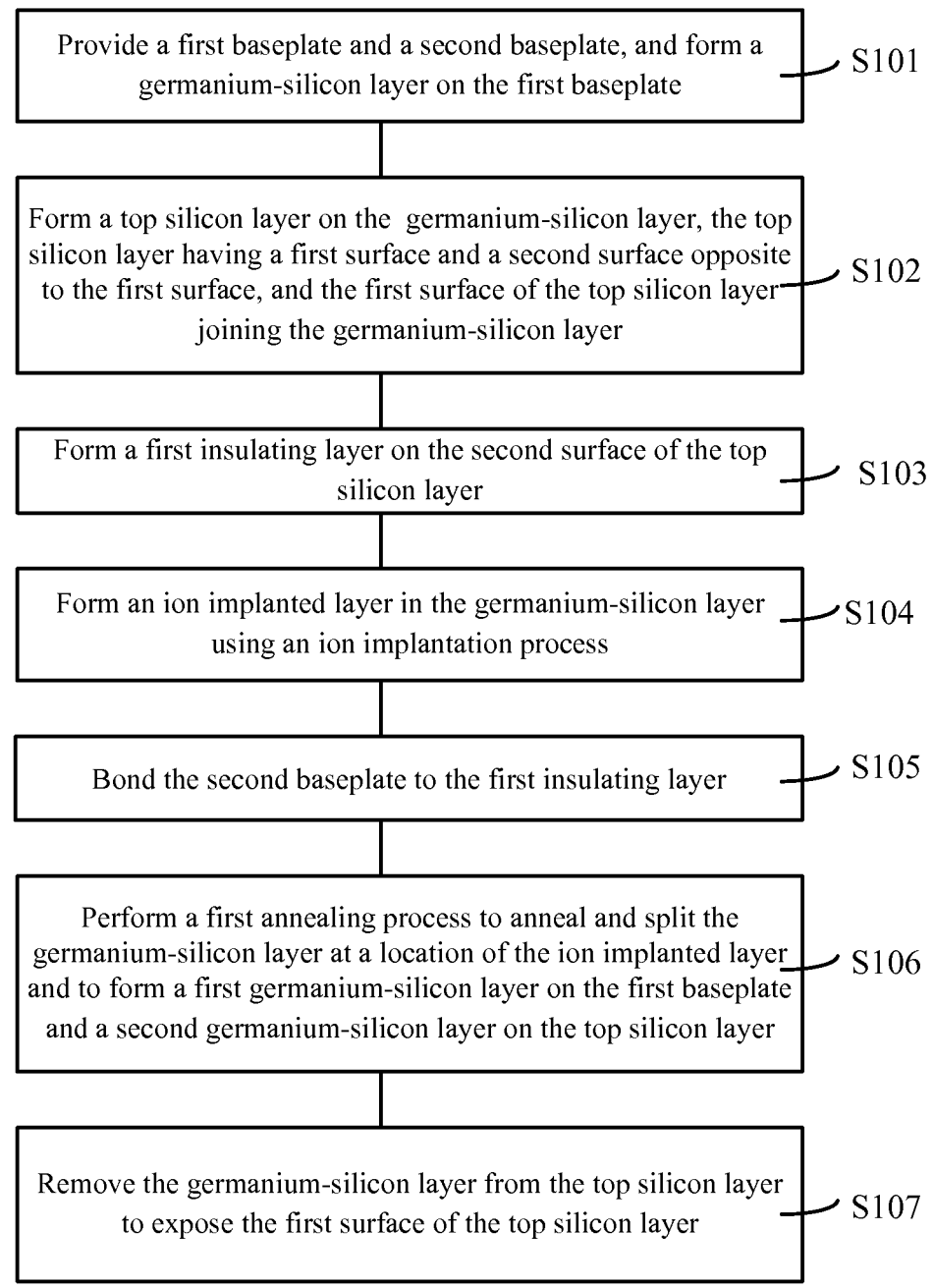
FIG. 5 is a flow chart of an exemplary method for forming an SOI substrate according to various disclosed embodiments.

FIG. 5 is a flow chart of an exemplary method for forming an SOI substrate according to various disclosed embodiments.

FIG. 5 is a flow chart of a method for forming an SOI substrate according to various disclosed embodiments, the exemplary method in FIG. 5 includes: providing a first baseplate and a second baseplate, and forming a silicon-germanium (SiGe) layer on the first baseplate in Step S101; forming a top silicon layer on the silicon-germanium layer in Step S102, the top silicon layer having a first surface and a second surface opposite to the first surface, the first surface of the top silicon layer being in contact with the silicon-germanium layer; forming a first insulating layer on the second surface of the top silicon layer in Step S103; forming an ion implanted layer in the silicon-germanium layer using an ion implantation process in Step S104; bonding the second baseplate to the first insulating layer in Step S105; annealing the germanium-silicon layer in Step S106, so that the germanium-silicon layer splits at the position of the ion implanted layer and is divided into a first germanium-silicon layer located on the surface of the first baseplate and a second germanium-silicon layer on the surface of the top silicon layer; and removing the second germanium-silicon layer on the surface of the top silicon layer in Step S107, until the first surface of the top silicon layer is exposed, the top silicon layer, the first insulating layer and the second baseplate forming the SOI substrate.

Specifically, reference is made to FIGS. 6-13 which are cross-sectional structure diagrams illustrating an exemplary process for forming the SOI substrate corresponding to the method depicted in FIG. 5.

Figure 6:
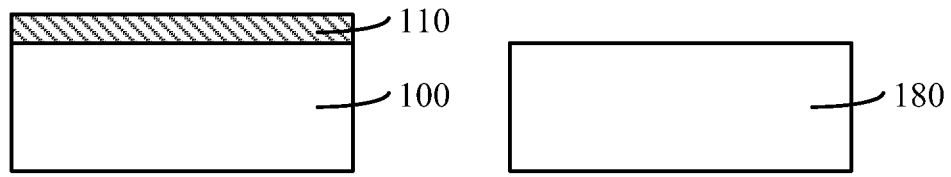
FIGS. 6-13 are cross-sectional structure diagrams illustrating an exemplary process for forming an SOI substrate according to various disclosed embodiments.

In FIG. 6, a first baseplate 100 and a second baseplate 180 are provided. A silicon-germanium layer 110 is formed on the surface of the first baseplate 100. In some embodiments, the first baseplate 100 and the second baseplate 180 are monocrystalline silicon sheets. In other embodiments, the first baseplate 100 and the second baseplate 180 can be monocrystalline germanium sheets.

The process for forming the silicon-germanium layer 110 includes one or more of the following processes: magnetron sputtering, molecular beam epitaxy, ultra-high vacuum chemical vapor deposition (UHVCVD), and ultraviolet photochemical vapor deposition (UVCVD). In an embodiment, the process for forming the silicon-germanium layer 110 is the ultra-high vacuum chemical vapor deposition process. Such process includes: for example, placing the first baseplate 100 in an ultra-high vacuum chemical vapor deposition apparatus; introducing silane and germane at a temperature of about 500° C. to about 600° C. and under a pressure of about 10 Pa to about 20 Pa, to form silicon-germanium nuclei on the surface of the first baseplate 100; then decreasing the pressure to about 0.01 Pa to about 0.1 Pa at the temperature of about 500° C. to about 600° C.; and forming a continuous silicon-germanium layer 110 on the surface of the first baseplate 100. The content of germanium in the silicon-germanium layer can be controlled by adjusting flow rates of the silane and/or the germane, so that the formed silicon-germanium layer has a desired high etch selectivity over a top silicon layer during a subsequent etching of the silicon-germanium layer. This can facilitate thickness control of the top silicon layer. In one embodiment, a molar percentage range of germanium in the silicon-germanium layer 110 is about 10% to about 60%.

The thickness range of the silicon-germanium layer 110 is about 50 nm to about 100 nm. In some embodiments, the subsequently-formed ion implanted layer is formed in the silicon-germanium layer 110, which requires the thickness of the silicon-germanium layer to be sufficiently high. This is because, if the silicon-germanium layer is too thin, partial thickness of the top silicon layer may be stripped off when cracking occurs at the ion implanted layer. Therefore, the thickness of the top silicon layer is difficult to control. In other embodiments, the subsequently formed ion implanted layer is located in the first baseplate 100 and thus the thickness of the silicon-germanium layer can be controlled to be thin to reduce a processing time for subsequently etching and removing the silicon-germanium layer 110.

Figure 7:
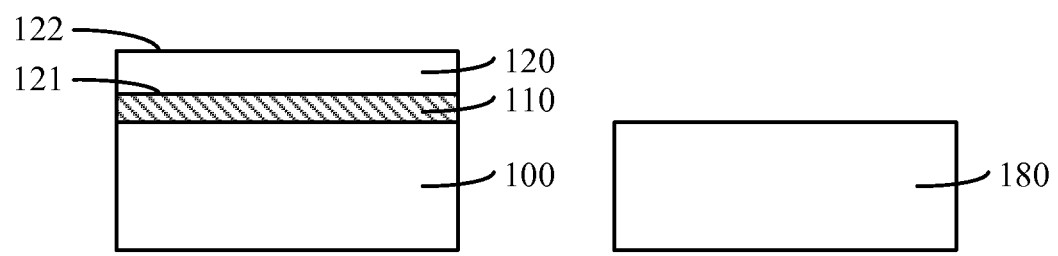

In FIG. 7, a top silicon layer 120 is formed on the surface of the silicon-germanium layer 110. The top silicon layer 120 can have a first surface 121 and a second surface 122 opposite to the first surface 121, the first surface 121 of the top silicon layer 120 joining the silicon-germanium layer 110.

Since after the SOI substrate is formed, the whole semiconductor device is formed on the surface of the top silicon layer 120. The thickness of the top silicon layer 120 along with existence of defects may affect electrical properties of semiconductor device(s) to be formed on the top silicon layer 120 of the subsequently-formed SOI substrate. To control the thickness of the top silicon layer and to reduce surface roughness of the top silicon layer, e.g., formed by cracking, the disclosed top silicon layer 120 can be formed by, e.g., a chemical vapor deposition, a magnetron sputtering, or a molecular beam epitaxy, which allows the top silicon layer 120 to be formed with a dense structure and a smooth surface without producing defects in the top silicon layer 120 and thus in the semiconductor device(s) formed thereon. Thickness of the top silicon layer 120 can be controlled by such process including, e.g., the chemical vapor deposition, the magnetron sputtering, or the molecular beam epitaxy.

When the subsequently-formed ion implanted layer is not formed in the top silicon layer 120 as disclosed herein (e.g., instead, in the first baseplate 100 and/or the silicon-germanium layer 110), splitting at the position of the ion implanted layer has no effect on the thickness and surface roughness of the top silicon layer 120. The thickness of the top silicon layer 120 can thus be any thickness as required by the SOI substrate, which is simple and convenient. Furthermore, in the subsequent processes, the silicon-germanium layer located on the surface of the top silicon layer is removed by a wet etching process or a dry etching process, with high etch selectivity over silicon. Low surface roughness of the silicon layer, exposed after the silicon-germanium layer is removed, can be obtained without producing defects in the semiconductor device(s) formed on the top silicon layer.

In some embodiments, the SOI substrate is an ETSOI substrate and the top silicon layer is thin having a thickness in a range of about 10 nm to about 100 nm. In other embodiments, the thickness of the top silicon layer of the SOI substrate can be greater than about 100 nm.

Figure 8:
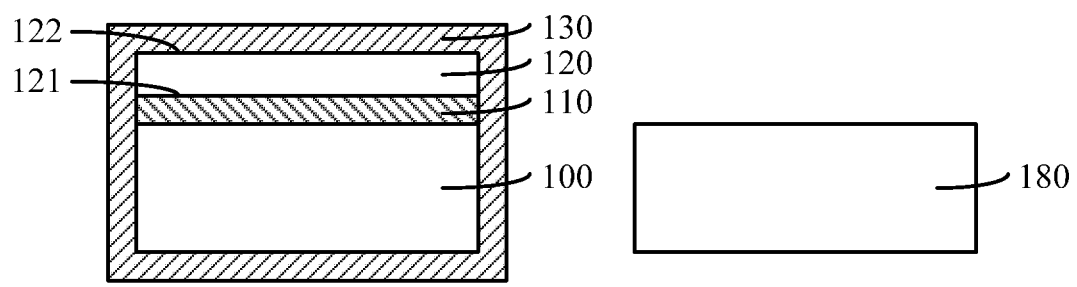

In FIG. 8, a first insulating layer 130 is formed at least on the second surface 122 of the top silicon layer 120. The first insulating layer 130 is used as an insulating layer of the SOI substrate to isolate the top silicon layer 120 from a substrate silicon layer of the SOI substrate. The first insulating layer 130 can serve as an ion implanted protection layer to protect the top silicon layer from being damaged by the subsequently implanted ions with high energy to avoid occurrence of defects in the semiconductor device(s) to be formed on the SOI substrate. In an embodiment, the first insulating layer 130 is a silicon oxide layer, and the process for forming the silicon oxide layer is a thermal oxidation process or a chemical vapor deposition process. In another embodiment, the first insulating layer 130 is formed on both the second surface 122 of the top silicon layer 120 and the surface of the first baseplate 100. In yet another embodiment, the first insulating layer can be formed only on the second surface of the top silicon layer.

In some embodiments, the first insulating layer 130 is formed on the second surface 122 of the top silicon layer 120, and no insulating layer is formed on the surface of the second baseplate 180. The formed SOI substrate can include the top silicon layer 120, the first insulating layer 130, and the second baseplate 180.

Figure 9:
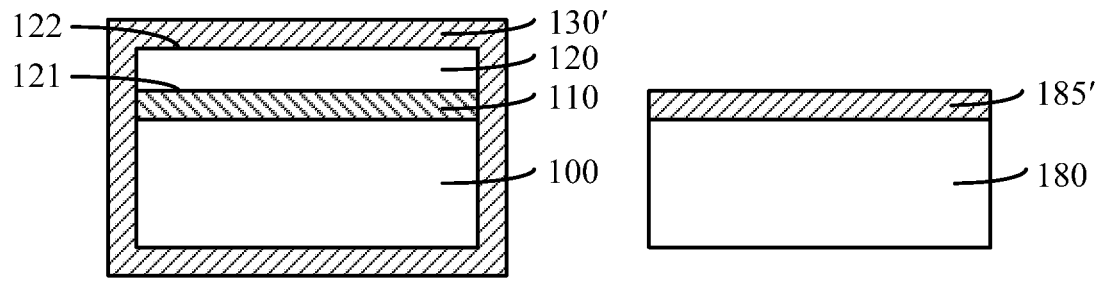

In other embodiments, referring to FIG. 9, a first insulating layer 130' is formed on the second surface 122 of the top silicon layer 120 and a second insulating layer 185' is formed on the surface of the second baseplate 180. The material of the second insulating layer 185' and the material of the first insulating layer 130' are, e.g., silicon oxide. In a subsequent bonding process, the second insulating layer 185' is bonded to the first insulating layer 130' to form a third insulating layer between the top silicon layer 120 and the second baseplate 180. The formed exemplary SOI substrate thus includes the top silicon layer 120, the third insulating layer (bonded by insulating layers 130' and 185'), and the second baseplate form 180.

In various embodiments, the third insulating layer bonded by insulating layers 130' and 185' can have a thickness equal to the thickness of the first insulating layer 130 as shown in FIG. 8. The thickness of the first insulating layer 130' in FIG. 9 is less than the thickness of the first insulating layer 130 in FIG. 8, so that the implantation energy required in the subsequent ion implantation is low enough without damaging the first insulating layer 130' and the top silicon layer 120. The semiconductor device formed on the SOI substrate can have less or no defects. Also, in some embodiments, the material of the second insulating layer 185' and the material the first insulating layer 130' are the same to facilitate improvement of the bonding power between the second insulating layer 185' and the first insulating layer 130'.

Figure 10:
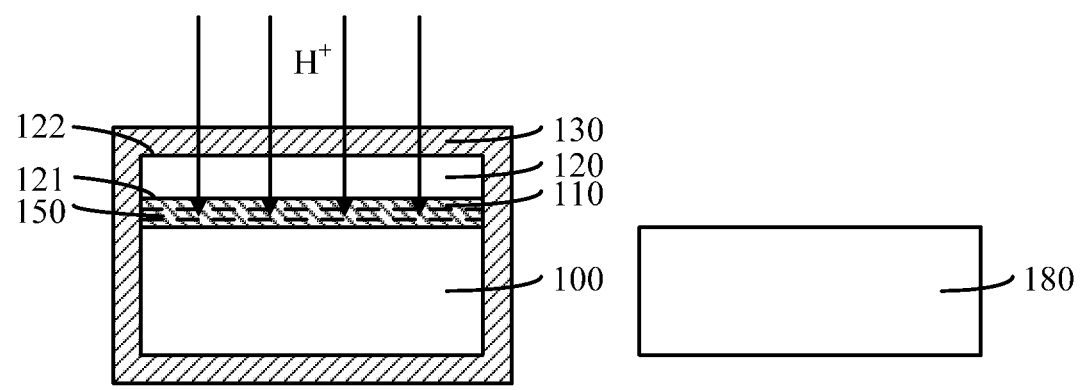

Referring to FIG. 10, an ion implanted layer 150 is formed in the silicon-germanium layer 110, e.g., using an ion implantation process.

The ions implanted in the ion implantation process are hydrogen ions or a combination of hydrogen ions and rare gas ions. The rare gas ions are helium ions, neon ions, argon ions, or the like. When the ions implanted in the ion implantation process are the hydrogen ions, the range of the implantation dosage of the hydrogen ions is about 1e16/cm$^2$ to about 1e17/cm$^2$.

Figure 12:
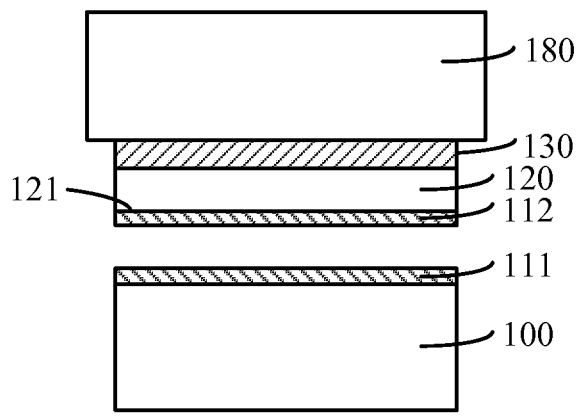

The ion implanted layer 150 is formed in the silicon-germanium layer 110. In one embodiment, the ion implanted layer 150 is formed through an entire thickness of the silicon-germanium layer 110. In one embodiment, the ion implanted layer 150 and the silicon-germanium layer 110 have a same distance away from the surface of the first insulating layer 130. In a subsequent high temperature annealing, the hydrogen ions and/or rare gas ions in the ion implanted layer 150 can form micro-bubbles of hydrogen and/or rare gas. The micro-bubbles may lead to the cracking and splitting of the ion implanted layer 150 and divide the silicon-germanium layer 110 into two parts (e.g., as shown in FIG. 12) to separate the first baseplate from the second baseplate.

Figure 11:
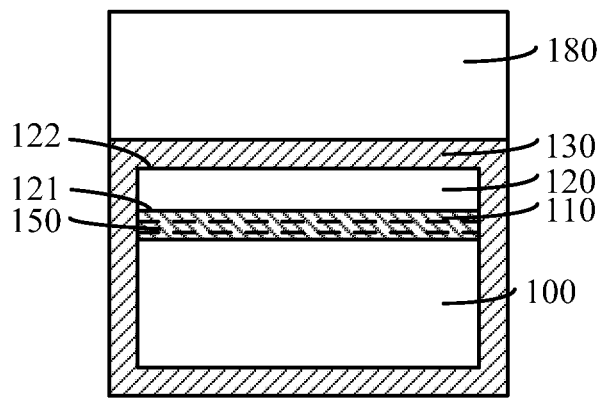

Referring to FIG. 11, the second baseplate 180 is bonded to the first insulating layer 130. Before the second baseplate 180 is bonded to the first insulating layer 130, the surface of the second baseplate 180 and the surface of the first insulating layer 130 are cleaned. Such cleaning includes physical cleaning and chemical cleaning as desired. After cleaning the surface of the second baseplate 180 and the surface of the first insulating layer 130, particles, impurity ions, and the like on the surface of the second baseplate 180 and the surface of the first insulating layer 130 can be removed. No defects between the surface of the second baseplate 180 and the surface of the first insulating layer 130 are obtained after bonding. If there are particles and impurity ions on the surface of the second baseplate 180 and the surface of the first insulating layer 130, the bonding power between the second baseplate 180 and the first insulating layer 130 can be reduced.

The bonding process for bonding the second baseplate 180 to the first insulating layer 130 includes a normal temperature (e.g., room temperature) bonding and a high temperature bonding. Exemplary normal temperature bonding is that: at room temperature (e.g., about 20° C. to about 25° C.), applying a pressure to bond the second baseplate 180 to the first insulating layer 130. Exemplary high temperature bonding is that: at a high temperature (e.g., higher than about 50° C. and lower than about 200° C.), applying a pressure to bond the second baseplate 180 to the first insulating layer 130.

In one embodiment, the bonding process includes: adjoining the second baseplate 180 with the first insulating layer 130; applying a pressure of about 0.1 N/cm$^2$ to about 10 N/cm$^2$ between the second baseplate 180 and the first insulating layer 130 at a temperature of about 80° C. to about 200° C. for about 2 hours to about 8 hours so that the second baseplate 180 is bonded to the first insulating layer 130.

Referring to FIG. 12, a first annealing process is performed to anneal the silicon-germanium layer 110, so that the silicon-germanium layer 110 cracks at the ion implanted layer 150 to form a silicon-germanium layer 111 on the surface of the first baseplate 100 and a second silicon-germanium layer 112 on the surface of the top silicon layer 120.

The ion implanted layer 150 is filled with hydrogen ions and/or other rare gas ions and after the first annealing process is performed to anneal the silicon-germanium layer 110, micro-bubbles are formed in the ion implanted layer 150 by those ions. After a certain number of the ions form the micro-bubbles, the silicon-germanium layer 110 cracks at the location of the ion implanted layer 150, and the silicon-germanium layer 110 is divided into the first silicon-germanium layer 111 on the surface of the first baseplate 100 and the second silicon-germanium layer 112 on the surface of the top silicon layer 120. In one embodiment, a temperature range of the first annealing is about 400° C. to about 600° C.

After the first silicon-germanium layer 111 is removed with the first baseplate 100, the first baseplate 100 can be reused, e.g., as a first baseplate or a second baseplate for manufacturing another SOI substrate.

After the silicon-germanium layer 110 is divided into the first silicon-germanium layer 111 and the second silicon-germanium layer 112, a second annealing process is performed to anneal the first insulating layer 130 and the second baseplate 180. The second annealing process may be performed at a temperature range of about 900° C. to about 1100° C. for a time range of about 1 hour to about 2 hours. In this manner, the bonding power between the first insulating layer 130 and the second baseplate 180 is enhanced to avoid separation of the first insulating layer 130 from the second baseplate 180 during subsequent formation of the SOI substrate. The bonding process for bonding the first insulating layer 130 to the second baseplate 180 is performed at a relatively low temperature, for example even in the high-temperature bonding, the temperature is no greater than about 200° C. If the temperature is too high (e.g., greater than about 200° C.), the hydrogen/rare gas ions in the silicon-germanium layer 110 may form micro-bubbles before the first insulating layer 130 and the second baseplate 180 are fully or completely bonded.

Cracking of the silicon-germanium layer 110 thus occurs, leading to poor bonding power between the first insulating layer 130 and the second baseplate 180. Therefore, the second annealing process is performed to anneal the first insulating layer 130 and the second baseplate 180 only after the silicon-germanium layer 110 is divided into the first silicon-germanium layer 111 and the second silicon-germanium layer 112 in a temperature range of about 900° C. to about 1100° C. This can further improve the bonding power between the first insulating layer 130 and the second baseplate 180.

Figure 13:
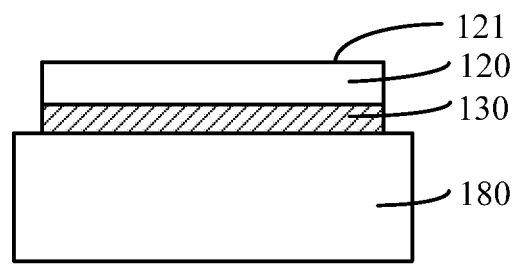

Referring to FIG. 13, the second silicon-germanium layer 112 (as shown FIG. 12) is removed from the surface of the top silicon layer 120 to expose the first surface 121 of the top silicon layer 120. The top silicon layer 120, the first insulating layer 130, and the second baseplate 180 form the SOI substrate.

The process for removing the second silicon-germanium layer 112 from the surface of the top silicon layer 120 includes a wet etching or a dry etching. For example, the solution for the wet etching includes a hydrogen peroxide solution and/or a hydrofluoric acid solution. The molar percent of hydrogen peroxide in the hydrogen peroxide solution is about 10% to about 50%. An etching temperature of the hydrogen peroxide solution ranges from about 40° C. to about 70° C. The molar percent of HF in the hydrofluoric acid solution is about 49%. In another example, an etching gas is used for the dry etching and may include a gas mixture of $CH_2F_2$, $CF_4$, $N_2$, and/or $O_2$. Plasma of such gas mixture is utilized to dry-etch the second silicon-germanium layer 112. Alternatively, the etching gas may be HCl gas, and plasma of the HCl gas is utilized to etch the second silicon-germanium layer 112.

During the above etching processes, the silicon-germanium layer and the top silicon layer have a desired etch selectivity over each other, such that the top silicon layer remains un-etched while removing the silicon-germanium layer using the etching process. This facilitates thickness control of the top silicon layer. For example, the first surface 121 of the top silicon layer 120 is undamaged and the surface roughness of the first surface 121 of the top silicon layer 120 is sufficiently low to facilitate formation of semiconductor device(s) on the first surface 121 of the top silicon layer 120. In addition, no polishing process is needed to polish the top silicon layer, which further facilitates thickness control of the top silicon layer 120 of the formed SOI substrate.

Figure 14:
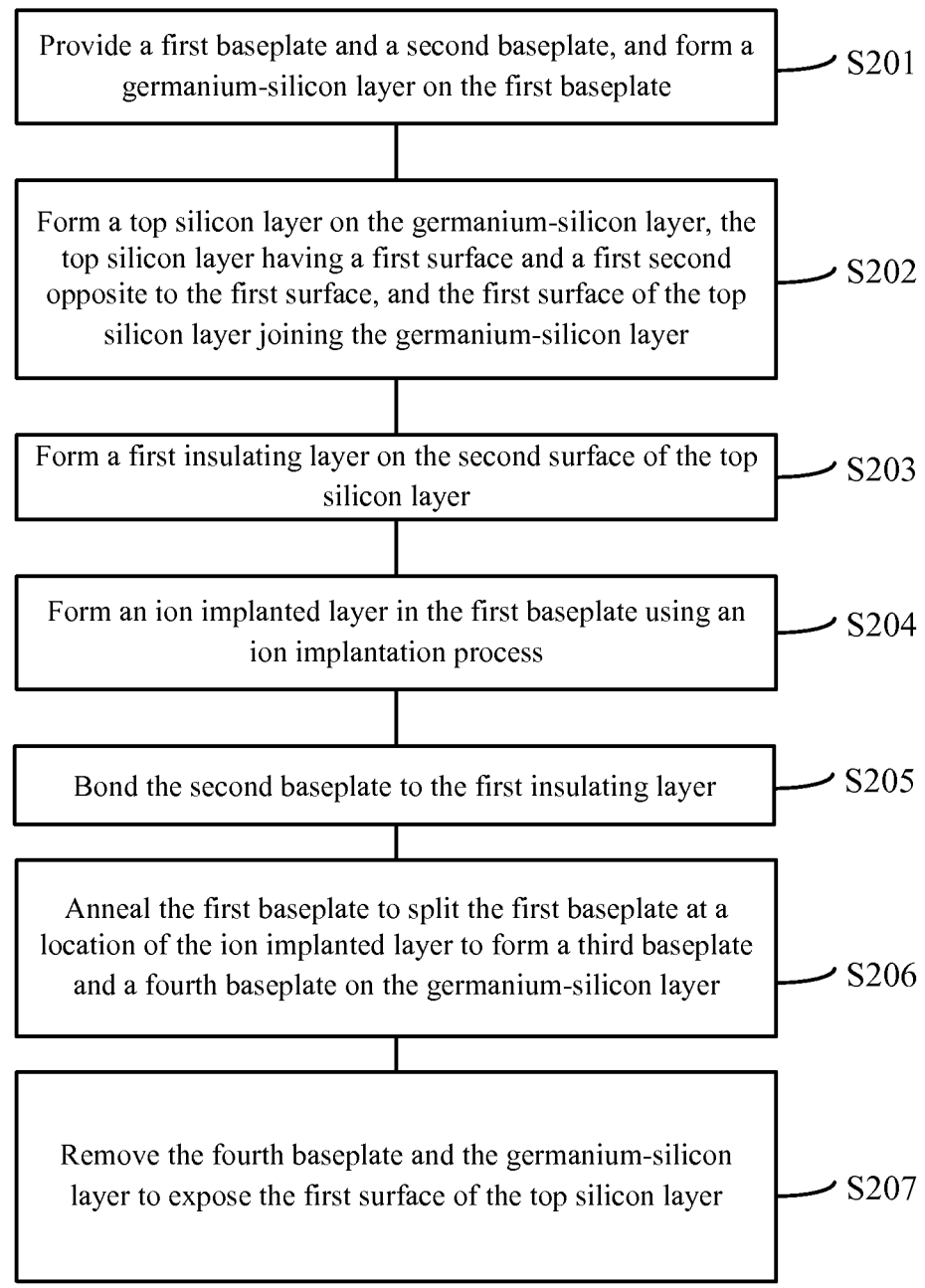
FIG. 14 is a flow chart of another exemplary method for forming an SOI substrate according to various disclosed embodiments.

FIG. 14 depicts a flow chart of another exemplary method for forming an SOI substrate according to various disclosed embodiments. The exemplary method can include, for example, providing a first baseplate and a second baseplate, and forming a silicon-germanium layer on the surface of the first baseplate in Step S201; forming a top silicon layer on the surface of the silicon-germanium layer in Step S202, the top silicon layer having a first surface and a first second opposite to the first surface, and the first surface of the top silicon layer being in contact with the silicon-germanium layer; forming a first insulating layer on the second surface of the top silicon layer in Step S203; forming an ion implanted layer in the first baseplate by using an ion implantation process in Step S204; bonding the second baseplate to the first insulating layer in Step S205; annealing the first baseplate in Step S206, so that the first baseplate cracks at the location of the ion implanted layer and is divided into a third baseplate and a fourth baseplate located on the surface of the silicon-germanium layer; and removing the fourth baseplate and the silicon-germanium layer in Step S207 to expose the first surface of the top silicon layer, with the top silicon layer, the first insulating layer and the second baseplate forming the SOI substrate.

FIGS. 15-18 are cross-sectional structure diagrams illustrating another exemplary method for forming an SOI substrate, corresponding to the method depicted in FIG. 14. As described above, Steps S201, S202, and S203 depicted in FIG. 14 can be the same as Steps S101, S102, and S103 depicted in FIG. 5. FIGS. 15-18 thus depict exemplary cross-sectional structure diagrams corresponding to Steps S204, S205, S206, and S207 described in FIG. 14.

Figure 15:
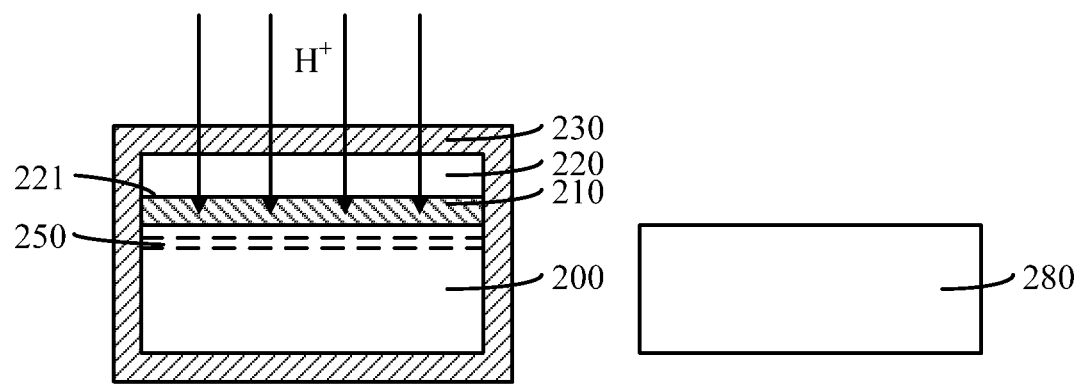
FIGS. 15-18 are cross-sectional views of another exemplary process for forming an SOI substrate according to various disclosed embodiments.

Referring to FIG. 15, an ion implanted layer 250 is formed in the first baseplate 200, e.g., by using an ion implantation process.

The ions implanted in the ion implantation process include hydrogen ions or a combination of hydrogen ions and rare gas ions. The rare gas ions are helium ions, neon ions, argon ions, and/or the like. When the ions implanted in the ion implantation process are the hydrogen ions, the range of the implantation dosage of hydrogen ions is about $1e16/cm^2$ to about $1e17/cm^2$.

The ion implanted layer 250 is formed and located in the first baseplate 200. The ion implanted layer 250 and the first baseplate 200 have a same distance from a second insulating layer 230. In a high temperature annealing, the hydrogen ions and/or rare gas ions in the ion implanted layer 250 can form micro-bubbles of hydrogen and/or rare gas. The micro-bubbles can lead to cracking of the ion implanted layer 250. The first baseplate is thus divided into two parts.

Figure 16:
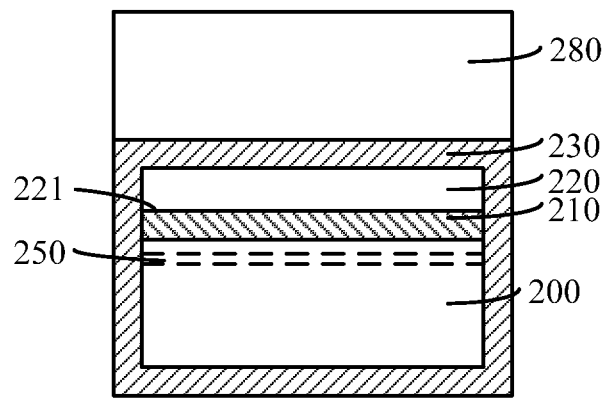

Referring to FIG. 16, a second baseplate 280 is bonded to the first insulating layer 230. Before the second baseplate 280 is bonded to the first insulating layer 230, the surface of the second baseplate 280 and the surface of the first insulating layer 230 are cleaned. The cleaning process includes a physical cleaning and/or chemical cleaning. After cleaning the surfaces of the second baseplate 280 and the first insulating layer 230, particles, impurity ions, and the like on the surfaces of the second baseplate 280 and the first insulating layer 230 can be removed. No defects can be formed between the surfaces of the second baseplate 280 and the first insulating layer 230 after bonding. If there are particles and impurity ions on the surfaces of the second baseplate 280 and the first insulating layer 230, the bonding power between such surfaces can be reduced.

The bonding process for bonding the second baseplate 280 to the first insulating layer 230 includes a normal temperature (e.g., room temperature) bonding and a high temperature bonding. The normal temperature bonding includes: at room temperature (e.g., about 20° C. to about 25° C.), applying a pressure to bond the second baseplate 280 to the first insulating layer 130. The high temperature bonding includes: at a higher temperature (e.g., higher than 50° C.), applying a pressure to bond the second baseplate 280 to the first insulating layer 230.

In an embodiment, the bonding process includes: placing the second baseplate 280 and the first insulating layer 230 in contact with each other; applying a pressure of about 0.1 $N/cm^2$ to about 10 $N/cm^2$ between the second baseplate 280 and the first insulating layer 230 at a temperature of about 80° C. to about 200° C. for about 2 hours to about 8 hours to bond the second baseplate 280 to the first insulating layer 230.

Figure 17:
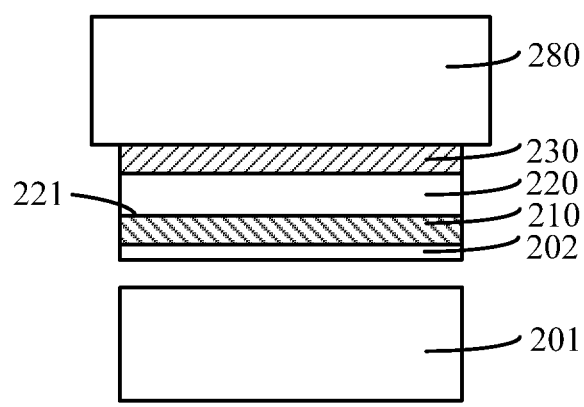

Referring to FIG. 17, a first annealing process is performed to anneal the first baseplate 200. The first baseplate 200 cracks at the location of the ion implanted layer 250 and is divided into a third baseplate 201 and a fourth baseplate 202 (on the surface of the silicon-germanium layer 210).

The ion implanted layer 250 is filled with implanted ions (e.g., hydrogen ions) and after the first annealing process is performed to anneal the silicon-germanium layer 210, micro-bubbles are formed in the ion implanted layer 250 by the implanted ions. After a certain number of implanted (e.g., hydrogen) ions form the micro-bubbles, the first baseplate 200 cracks at the location of the ion implanted layer 250, and the first baseplate 200 is divided into a third baseplate 201 and a fourth baseplate 202 (which is on the surface of the silicon-germanium layer 210). In an embodiment, a temperature range of the first annealing is about 400° C. to about 600° C.

After the chemical mechanical polishing and/or cleaning processes are performed, the third baseplate 201 can be reused, e.g., as a first baseplate or a second baseplate for manufacturing another SOI substrate.

After the first baseplate 200 is divided into the third baseplate 201 and the fourth baseplate 202, a second annealing process is processed to anneal the first insulating layer 230 and the second baseplate 280. The second annealing process can be performed at a temperature range of about 900° C. to about 1100° C. for a time range of about 1 hour to about 2 hours. In this manner, the bonding power between the first insulating layer 230 and the second baseplate 280 is enhanced to avoid separation of the first insulating layer 230 from the second baseplate 180 during subsequent formation of the SOI substrate. The bonding process for bonding the first insulating layer 230 to the second baseplate 280 is performed at a relatively low temperature, for example even in the high-temperature bonding, the temperature is no greater than about 200° C. If the temperature is too high (e.g., greater than about 200° C.), the hydrogen ions may form micro-bubbles before the first insulating layer 230 and the second baseplate 280 are fully or completely bonded. Cracking of the silicon-germanium layer 210 thus occurs, leading to poor bonding power between the first insulating layer 230 and the second baseplate 280. Therefore, the second annealing process is performed to anneal the first insulating layer 230 and the second baseplate 280 only after the first baseplate 200 is divided into the third baseplate 201 and the fourth baseplate 202 in a temperature range of about 900° C. to about 1100° C. This can further improve the bonding power between the first insulating layer 230 and the second baseplate 280.

Figure 18:
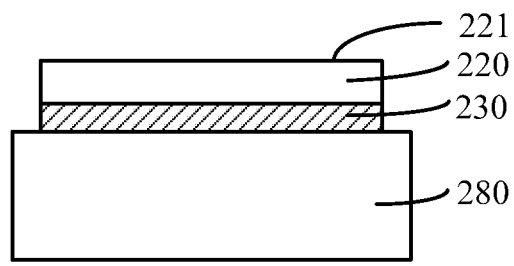

Referring to FIG. 18, the fourth baseplate 202 along with the silicon-germanium layer 210 (as shown FIG. 17) are removed to expose the first surface 221 of the top silicon layer 220. The top silicon layer 220, the first insulating layer 230, and the second baseplate 280 can thus form the SOI substrate.

The process for removing the fourth baseplate 202 includes a wet etching, a dry etching and/or a chemical mechanical polishing. In one embodiment, the process for removing the fourth baseplate 202 is the chemical mechanical polishing. When removing the fourth baseplate 202 using the chemical mechanical polishing, partial thickness of the silicon-germanium layer 210 can be removed by the chemical mechanical polishing. Because a portion of the silicon-germanium layer 210 has been removed in this process, an etching time required for subsequently removing the silicon-germanium layer 210 can be reduced.

The process for removing the silicon-germanium layer 210 includes a wet etching or a dry etching. For example, the solution for the wet etching includes a hydrogen peroxide solution and/or a hydrofluoric acid solution. The molar percent of the hydrogen peroxide in the hydrogen peroxide solution is about 10% to about 50%. An etching temperature of the hydrogen peroxide solution ranges from about 40° C. to about 70° C. The molar percent of HF in the hydrofluoric acid solution is about 49%. In another example, an etching gas is used in the dry etching and may include a gas mixture of $CH_2F_2$, $CF_4$, $N_2$, and/or $O_2$. Plasma of such gas mixture is utilized to dry-etch the silicon-germanium layer 210. Alternatively, the etching gas may be HCl gas, and plasma of the HCl gas is utilized to etch the silicon-germanium layer 210.

During the above etching processes, the silicon-germanium layer and the top silicon layer have a desired etch selectivity over each other. The top silicon layer is hardly etched while removing the silicon-germanium layer using the etching process. This facilitates thickness control of the top silicon layer. When removing the silicon-germanium layer using the etching processes, the first surface 221 of the top silicon layer is undamaged, and surface roughness of the first surface 221 of the top silicon layer 220 is controlled sufficiently low. This facilitates forming semiconductor device(s) on the first surface 221 of the top silicon layer 220. In addition, no polishing process is needed to polish the top silicon layer, which further facilitates the thickness control of the top silicon layer of the formed SOI substrate.

In this manner, the silicon-germanium layer is formed on the surface of the first baseplate. The top silicon layer is formed on surface of the silicon-germanium layer, and the first insulating layer is formed on the second surface of the top silicon layer. The ion implanted layer is formed in the silicon-germanium layer or the first baseplate by the ion implantation process. The second baseplate is bonded to the first insulating layer. A first annealing process is performed to anneal the first baseplate and the silicon-germanium layer so that the silicon-germanium layer or the first baseplate cracks at the location of the ion implanted layer. The silicon-germanium layer on the surface of the top silicon layer and/or on a part of the first baseplate on the surface of the silicon-germanium layer are removed to expose the first surface of the top silicon layer and thus to form the SOI substrate. Since the ion implanted layer is located in the first baseplate or the silicon-germanium layer, rather than located in the top silicon layer, cracking of the ion implanted layer in the first baseplate or the silicon-germanium layer does not affect the thickness and surface roughness of the top silicon layer. The thickness and surface roughness of the top silicon layer can then be easily controlled.

Further, the silicon-germanium layer is removed in the subsequent process by a wet etching process or a dry etching process having a high etch selectivity over the top silicon layer. This allows the thickness of the top silicon layer to be controlled and allows the surface roughness of the first surface of the top silicon layer to be sufficiently low to facilitate formation of semiconductor device(s) on the first surface of the top silicon layer.

The embodiments disclosed herein are exemplary only. Other applications, advantages, alternations, modifications, or equivalents to the disclosed embodiments are obvious to those skilled in the art and are intended to be included within the scope of the present disclosure.

What is claimed is:

1. A method for forming a silicon-on-insulator (SOI) substrate, comprising:
    providing a first baseplate and a second baseplate;
    forming a silicon-germanium layer on the first baseplate;
    forming a top silicon layer on the silicon-germanium layer, the top silicon layer having a first surface and a second surface opposite to the first surface, and the first surface of the top silicon layer joining the silicon-germanium layer;
    forming a first insulating layer on the second surface of the top silicon layer;
    after forming the first insulating layer, forming an ion implanted layer in an entire thickness of the silicon-germanium layer using an ion implantation process performed through the first insulating layer and the top silicon layer over the silicon-germanium layer;
    bonding the second baseplate to the first insulating layer;
    performing a first annealing process to anneal and split the silicon-germanium layer into a first silicon-germanium layer on the first baseplate and a second silicon-germanium layer on the top silicon layer; and
    removing the second silicon-germanium layer from the first surface of the top silicon layer to expose the top silicon layer and to form the SOI substrate comprising the first insulating layer formed between the top silicon layer and the second baseplate.

2. The method according to claim 1, wherein the silicon-germanium layer has a thickness ranging from about 50 nm to about 100 nm, and a molar percent of germanium in the silicon-germanium layer is about 10% to about 60%.

3. The method according to claim 1, wherein the forming of the silicon-germanium layer comprises one or more of a magnetron sputtering, a molecular beam epitaxy, an ultra-high vacuum chemical vapor deposition, and an ultraviolet photochemical vapor deposition.

4. The method according to claim 1, wherein the forming of the top silicon layer comprises a chemical vapor deposition, a magnetron sputtering, or a molecular beam epitaxy.

5. The method according to claim 1, wherein the ion implantation process implants ions comprising hydrogen ions or a combination of hydrogen ions and rare gas ions.

6. The method according to claim 5, wherein the ion implantation process implants ions comprising hydrogen ions having an implantation dosage ranging from about $1E16/cm^2$ to about $1E17/cm^2$.

7. The method according to claim 1, wherein a second insulating layer is formed on the second baseplate and bonded to the first insulating layer to form a third insulating layer comprising the first insulating layer and the second insulating layer, and wherein the top silicon layer, the third insulating layer, and the second baseplate form the SOI substrate.

8. The method according to claim 1, wherein the bonding of the second baseplate to the first insulating layer comprises a room temperature bonding and high temperature bonding.

9. The method according to claim 1, wherein the process for bonding the second baseplate to the first insulating layer comprises:
    placing the second baseplate and the first insulating layer in contact with each other; and
    applying a pressure of about $0.1$ N/cm$^2$ to about $10$ N/cm$^2$ to the second baseplate and the first insulating layer at a temperature of about 80° C. to about 200° C. for about 2 hours to about 8 hours.

10. The method according to claim 1, wherein the first annealing process is performed at a temperature of about 400° C. to about 600° C.

11. The method according to claim 1, further comprising a second annealing process performed after splitting at the ion implanted layer to anneal the first insulating layer and the second baseplate at a temperature ranging from about 900° C. to about 1100° C. for about 1 hour to about 2 hours.

12. The method according to claim 1, wherein the second silicon-germanium is removed by a wet etching using a hydrogen peroxide solution and a hydrofluoric acid solution.

13. The method according to claim 12, wherein a molar percent of hydrogen peroxide in the hydrogen peroxide solution is about 10% to about 50%, an etching temperature range of the hydrogen peroxide solution is about 40° C. to about 70° C. and an molar percent of hydrofluoric acid in the hydrofluoric acid solution is about 49%.

14. The method according to claim 1, wherein the second silicon-germanium is removed by a dry etching using an etching gas comprising a HCl gas or a gas mixture comprising $CH_2F_2$, $CF_4$, $N_2$ and $O_2$.

15. The method according to claim 1, wherein the first insulating layer is formed further on a bottom surface of the first baseplate opposing the silicon-germanium layer and on opposing sidewalls of each of the first baseplate, the silicon-germanium layer, and the top silicon layer.

16. The method according to claim 15, after bonding the second baseplate to the first insulating layer and before performing the first annealing process to anneal and split the silicon-germanium layer, further comprising: removing portions of the first insulating layer that are on the bottom surface of the first baseplate and on opposing sidewalls of each of the first baseplate, the silicon-germanium layer, and the top silicon layer.

17. A method for forming a silicon-on-insulator (SOI) substrate, comprising:
    providing a first baseplate and a second baseplate;
    forming a silicon-germanium layer on the first baseplate;
    forming a top silicon layer on the silicon-germanium layer, the top silicon layer having a first surface and a second surface opposite to the first surface, and the first surface of the top silicon layer joining the silicon-germanium layer;
    forming a first insulating layer on the second surface of the top silicon layer;
    after forming the first insulating layer, forming an ion implanted layer in the first baseplate using an ion implantation process through the first insulating layer, the top silicon layer, and the silicon-germanium layer;
    bonding the second baseplate to the first insulating layer;
    performing a first annealing process to anneal and split the first baseplate at the ion implanted layer, wherein the first baseplate is split into a third baseplate and a fourth baseplate, the third baseplate being on the silicon-germanium layer; and
    removing the silicon-germanium layer and the third baseplate from the first surface of the top silicon layer to expose the top silicon layer and to form the SOI substrate comprising the first insulating layer formed between the top silicon layer and the second baseplate.

18. The method according to claim 17, wherein the step of removing the silicon-germanium layer and the third baseplate comprises:
    removing the third baseplate from the silicon-germanium layer by a process comprising a wet etching, a dry etching or a chemical mechanical polishing, and
    removing the silicon-germanium layer by a process comprising a wet etching or a dry etching to expose the first surface of the top silicon layer and to form the SOI wafer.

19. The method according to claim 17, wherein the first insulating layer is formed further on a bottom surface of the first baseplate opposing the silicon-germanium layer and on opposing sidewalls of each of the first baseplate, the silicon-germanium layer, and the top silicon layer.

20. The method according to claim 17, after bonding the second baseplate to the first insulating layer and before performing the first annealing process to anneal and split the first baseplate, further comprising:
    removing portions of the first insulating layer that are on the bottom surface of the first baseplate and on opposing sidewalls of each of the first baseplate, the silicon-germanium layer, and the top silicon layer.

\* \* \* \* \*